(12) United States Patent
Lee et al.

(10) Patent No.: US 7,615,922 B2
(45) Date of Patent: Nov. 10, 2009

(54) ELECTRO-LUMINESCENT DISPLAY DEVICE AND METHOD FOR FABRICATING THE SAME

(75) Inventors: Shi-Hao Lee, Banciao (TW); Wei-Pang Huang, Hsinchu (TW); Kuo-Sheng Lee, Yongkang (TW); Fan-Hsiu Chang, Miaoli (TW)

(73) Assignee: AU Optronics Corp., Hsinchu (TW)

( * ) Notice: Subject to any disclaimer, the term of this patent is extended or adjusted under 35 U.S.C. 154(b) by 437 days.

(21) Appl. No.: 11/035,326

(22) Filed: Jan. 13, 2005

(65) Prior Publication Data

US 2006/0043886 A1 Mar. 2, 2006

(30) Foreign Application Priority Data

Aug. 30, 2004 (TW) ................. 93126047 A

(51) Int. Cl.
*H01J 63/04* (2006.01)
*H01J 1/62* (2006.01)
*H01L 35/24* (2006.01)

(52) U.S. Cl. ............... 313/506; 313/483; 313/498; 313/500; 313/501; 313/504; 313/505; 257/40; 428/690; 428/917

(58) Field of Classification Search ............ 313/506, 313/504
See application file for complete search history.

(56) References Cited

U.S. PATENT DOCUMENTS

| | | | | |
|---|---|---|---|---|
| 5,517,031 A | * | 5/1996 | Wei et al. | 250/370.08 |
| 5,693,956 A | * | 12/1997 | Shi et al. | 257/40 |
| 5,703,436 A | * | 12/1997 | Forrest et al. | 313/506 |
| 6,768,260 B2 | * | 7/2004 | Fukunaga et al. | 313/506 |
| 6,770,502 B2 | * | 8/2004 | Cok et al. | 438/40 |
| 6,835,954 B2 | * | 12/2004 | Park et al. | 257/72 |
| 6,836,070 B2 | * | 12/2004 | Chung et al. | 313/512 |
| 7,187,121 B2 | * | 3/2007 | Hasegawa et al. | 313/504 |
| 2003/0151360 A1 | * | 8/2003 | Fukunaga et al. | 313/506 |
| 2004/0062857 A1 | * | 4/2004 | Nagayama et al. | 427/66 |

FOREIGN PATENT DOCUMENTS

JP 2003303684 A * 10/2003
TW 519853 2/2003

OTHER PUBLICATIONS

Matlin, et al., Optically transparent indium-tin-oxide (ITO) ohmic contacts in the fabrication of vertical-cavity surface-emitting lasers, Electronics Letters, vol. 30, No. 4, Feb. 14, 1994.*
English translation of JP2003-303684 (Hasegawa).*

* cited by examiner

*Primary Examiner*—Nimeshkumar D. Patel
*Assistant Examiner*—Natalie K Walford
(74) *Attorney, Agent, or Firm*—Thomas, Kayden, Horstemeyer & Risley

(57) ABSTRACT

A top emission type electro-luminescent display device comprising a thin film transistor, an opaque electrode, an opaque layer, and an electro-luminescent medium layer. The thin film transistor overlies a substrate and is covered by an interlayer insulator. The opaque electrode and the opaque layer are successively disposed on the interlayer insulator, in which the opaque electrode is electrically connected to the thin film transistor and the opaque layer comprises an opening exposing a portion of the underlying opaque electrode. The electroluminescent medium layer is disposed over the exposed portion of the opaque electrode. The transparent electrode is disposed on the opaque layer and conformally covers the surfaces of the opening and the electro-luminescent medium layer.

20 Claims, 4 Drawing Sheets

ELECTRO-LUMINESCENT DISPLAY DEVICE AND METHOD FOR FABRICATING THE SAME

BACKGROUND

The invention relates to a flat panel display and in particular to a top emission type electro-luminescent (EL) device and method for fabricating the same.

Electro-luminescent (EL) devices, such as organic light-emitting diodes (OLEDs), are active lighting devices using organic materials. The EL device typically comprises an anode, a cathode, and an EL medium layer disposed therebetween. When an electrical potential difference is applied between the anode and the cathode, electrons and holes are injected into the EL-medium layer from the cathode and the anode, respectively. The injected electrons and holes are then recombined, releasing energy as light.

FIG. 1 illustrates a conventional bottom emission type electro-luminescent device. As shown in FIG. 1, a buffer layer 102 is formed on a substrate 100. A thin film transistor 111 is disposed on the buffer layer 102, comprising an active layer 104, a gate dielectric layer 106, a gate electrode 107, and source and drain electrodes 109. The active layer 104, such as a polysilicon layer, is. disposed on the buffer layer 102, comprising source and drain doping regions 105. The active layer 104 is covered by an insulating layer 106, such as a silicon nitride layer, serving as the gate dielectric layer. The gate electrode 107 is disposed on the gate dielectric layer 106 overlying the active layer 104 and covered by an interlayer dielectric (ILD) layer 108. The source and drain electrodes 109 are respectively disposed on both sides of the gate electrode 107 and electrically connected to the source and drain doping regions 105, respectively, by the contact holes in the ILD layer 108 and the underlying insulating layer 106. A first passivation layer 110 covers the thin film transistor 111 and the ILD layer 108, comprising a via hole to expose the source/drain electrode 109. A transparent electrode 112, such as an indium tin oxide (ITO) layer, is formed on a portion of the first passivation layer 110 and electrically connected to the exposed source/drain electrode 109 through the via hole. A second passivation layer is disposed on the first passivation layer 110 overlying the thin film transistor 111. An EL medium layer 116 covers the second passivation layer 114 and the transparent electrode 112. An opaque electrode 118, such as a metal material, is formed on the EL medium layer 116.

In FIG. 1, the transparent and opaque electrodes 112 and 118 serve as the anode and the cathode, respectively. Thus, the light is emitted in a downward direction from the EL medium layer 116 through the transparent electrode 112, providing a bottom emission type EL display device. The light-emitting area of the bottom emission type EL display device, however, is limited by thin film transistors. For example, the aperture ratio of the EL device is reduced while the number of the thin film transistors is increased. Accordingly, power consumption must be increased to maintain the EL display panel brightness, reducing the lifetime of devices.

SUMMARY

An electro-luminescent display device and a method for fabricating the same are provided. An embodiment of an electro-luminescent display device comprises a substrate comprising a first region and a second region, a thin film transistor, an interlayer insulator, an opaque electrode, an opaque layer, an electro-luminescent medium layer, and a transparent electrode. The thin film transistor is disposed on the first region of the substrate. The interlayer insulator is disposed on the second region of the substrate and covers the thin film transistor. The opaque electrode overlies the interlayer insulator and electrically connected to the thin film transistor. The opaque layer overlies the opaque electrode, having a first opening exposing a portion of the underlying opaque electrode. The electro-luminescent medium layer is disposed over the exposed portion of the opaque electrode. The transparent electrode is disposed on the opaque layer and conformally covers the surfaces of first opening and the electro-luminescent medium layer.

An embodiment of a method comprises providing a substrate comprising a first region and a second region. A thin film transistor is formed on the first region of the substrate. An interlayer insulator is formed on the second region of the substrate, covering the thin film transistor. An opaque electrode overlies the interlayer insulator, and electrically connects to the thin film transistor. An opaque layer overlies the opaque electrode, having a first opening exposing a portion of the underlying opaque electrode. An electro-luminescent medium layer is formed over the exposed portion of the opaque electrode. A transparent electrode is formed on the opaque layer and conformally covers the surfaces of the first opening and the electro-luminescent medium layer.

DESCRIPTION OF THE DRAWINGS

An electro-luminescent display device and a method for forming the same will become more fully understood from the detailed description given hereinbelow and the accompanying drawings, given by way of illustration only and thus not intended to be limitative of the invention.

DETAILED DESCRIPTION

Figure 1:
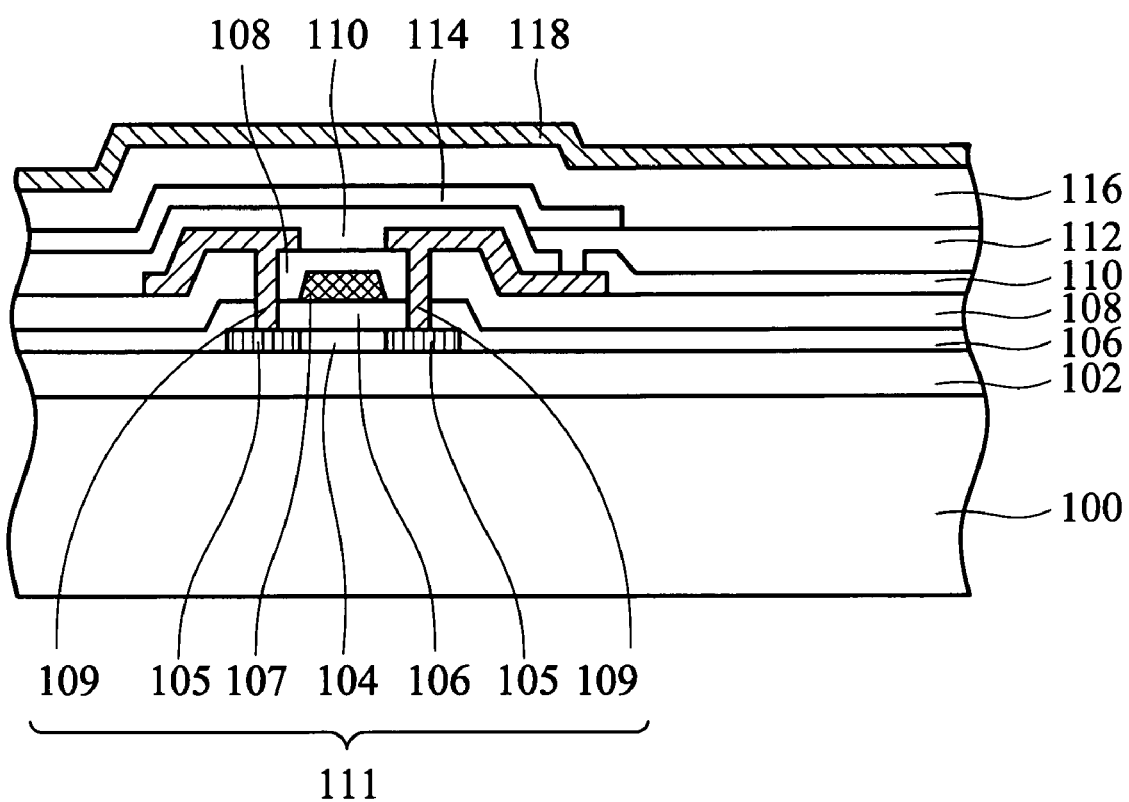
FIG. 1 is a cross-section of a conventional bottom emission type electro-luminescent display device.

An electro-luminescent display device and a method for forming the same will be described in greater detail in the following. FIG. 2F illustrates an embodiment of a top emission type electro-luminescent display device. The device comprises a substrate 200 comprising a first region 10 and a second region 20, a thin film transistor 215, an interlayer insulator 212, an opaque electrode 214, an electro-luminescent medium layer 222, and a transparent electrode. 224. In some embodiments, the first region 10 may be a transistor region and the second region 20 a light-emitting region. Moreover, the substrate 200 is covered by a buffer layer 202. The thin film transistor 215 is disposed on the buffer layer 202 of the first region 10 of the substrate 200, comprising an active layer 204 comprising source and drain doping regions 211, a gate dielectric layer 206, a gate electrode 207, and source and drain electrodes 213. An interlayer dielectric (ILD) layer 210 is disposed on the gate dielectric layer 206 and covers the gate electrode 207.

The interlayer insulator 212 overlies the interlayer dielectric layer 210 over the second region 20 of the substrate 200 and covers the thin film transistor 215 over the first region 10 of the substrate 200. Moreover, the interlayer insulator 212 comprises an opening to expose a source/drain electrode 213.

The opaque electrode 214 overlies the interlayer insulator 212 and is electrically connected to the thin film transistor 215 through the exposed source/drain electrode 213. The opaque electrode 214 over the second region 20 of the substrate 200 has a relative height higher than that of thin film transistor 215 over the first region 10 of the substrate 200. A transparent conductive layer 216 may be optionally disposed on the opaque electrode 214, serving as a portion of the electrode 214, such that the work function of the electrode 214 can match the subsequent electro-luminescent medium layer 222.

An insulating layer (passivation layer) 218 and the opaque layer 220 are successively disposed on the opaque electrode 214, in which the insulating layer 218 comprises an opening 219 to expose a portion of the opaque electrode 214 having the transparent conductive layer 216 thereon and the opaque layer 220 an opening 221 above the opening 219. In some embodiments, the opening 221 is in the second region 20 of the substrate 200 or across the first and second regions 10 and 20 of the substrate 200. Here, only the former is depicted. Moreover, the opening 221 may be larger than the opening 219 to further increase the aperture ratio. The electro-luminescent medium layer 222 is disposed on the bottom of the openings 221 and 219. The transparent electrode 224 is disposed on the opaque layer 220 and conformally covers the surfaces the opening 221 and the electro-luminescent medium layer 222.

When an electrical potential difference is applied between the electrodes 214 and 224, electrons and holes are injected into the electro-luminescent medium layer 222 from the electrodes 214 and 224, respectively. The injected electrons and holes are then recombined, releasing energy as light. The light is reflected in an upward direction from the opaque electrode 214. Therefore, the light-emitting area (aperture ratio) is not reduced even if the number of the thin film transistors is increased, maintaining or increasing the brightness of the electro-luminescent display device. In other words, the power consumption is not increased, potentially extending the lifetime of the electro-luminescent display device. Moreover, the opaque layer 220 overlying the opaque electrode 214 may block light from lateral scattering by the electro-luminescent medium layer 222, thereby improving wash-out effect, and consequently, display quality can be improved.

Figure 2A:
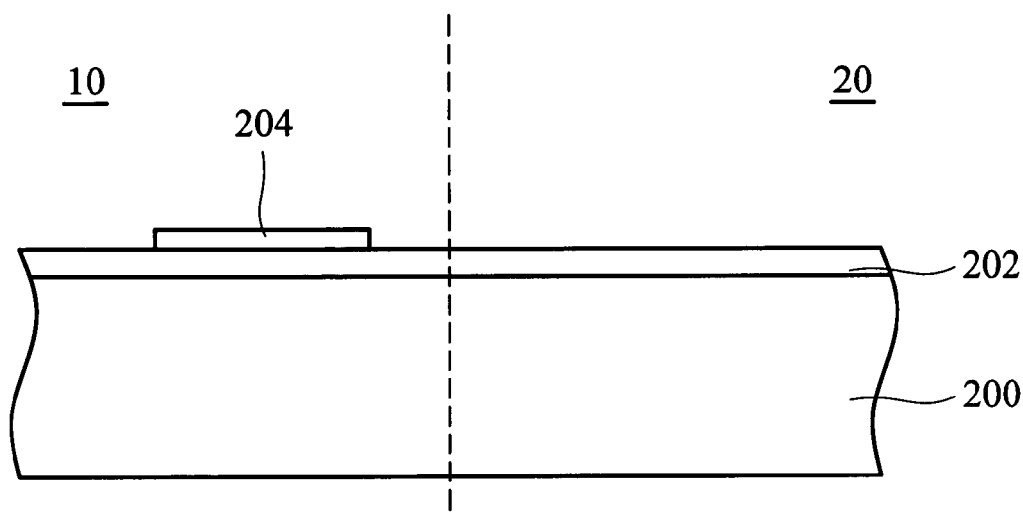
FIGS. 2A to 2F are cross-sections of an embodiment of a method for forming an electro-luminescent display device.
Figure 2B:
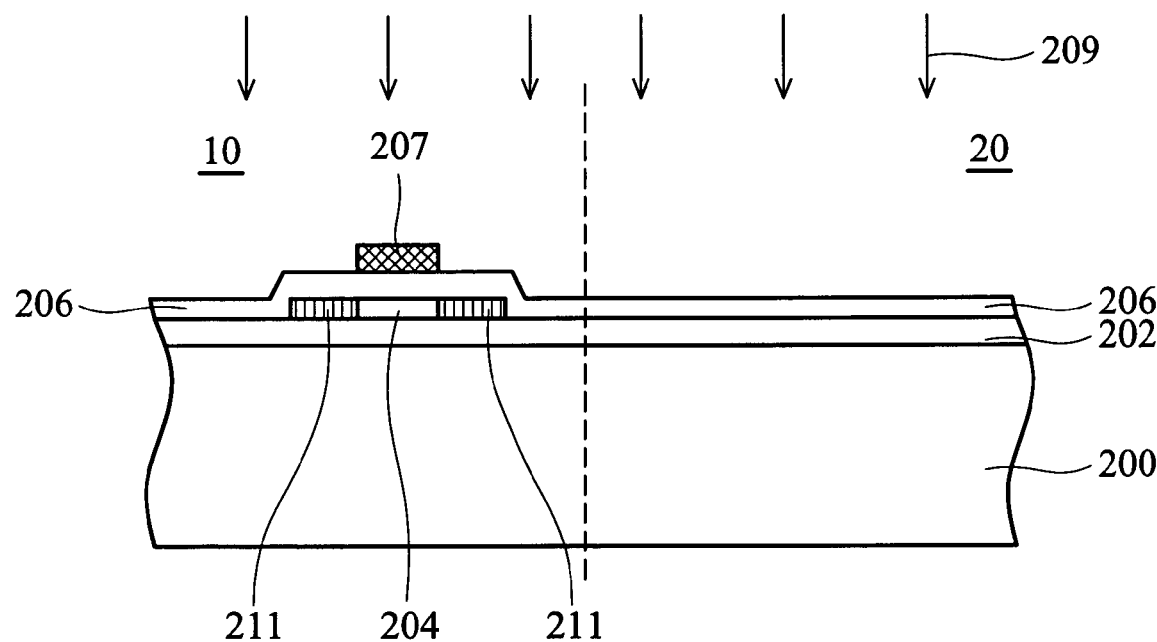
Figure 2C:
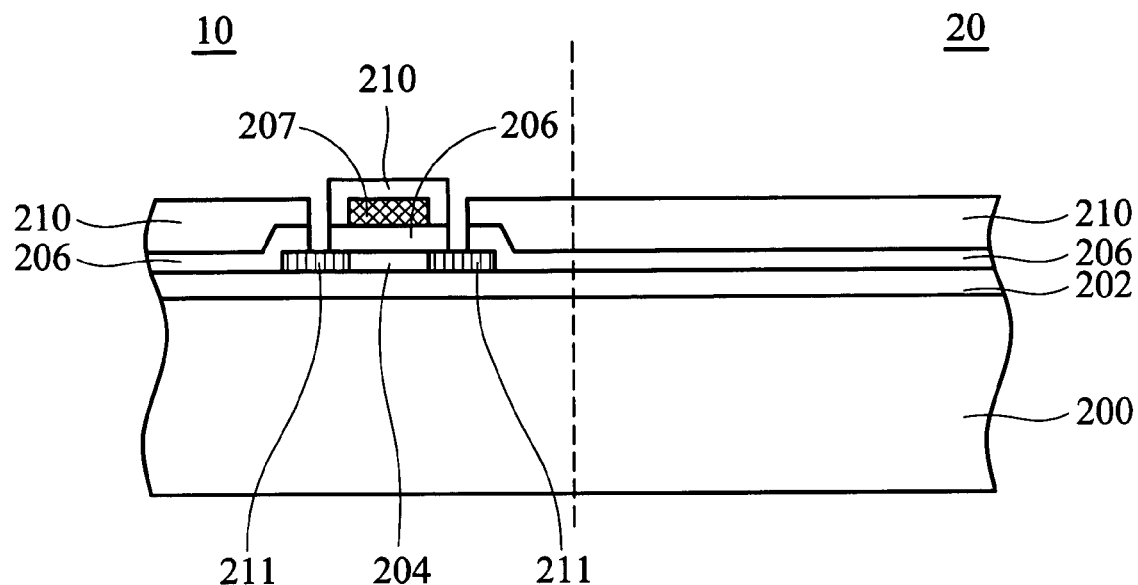
Figure 2D:
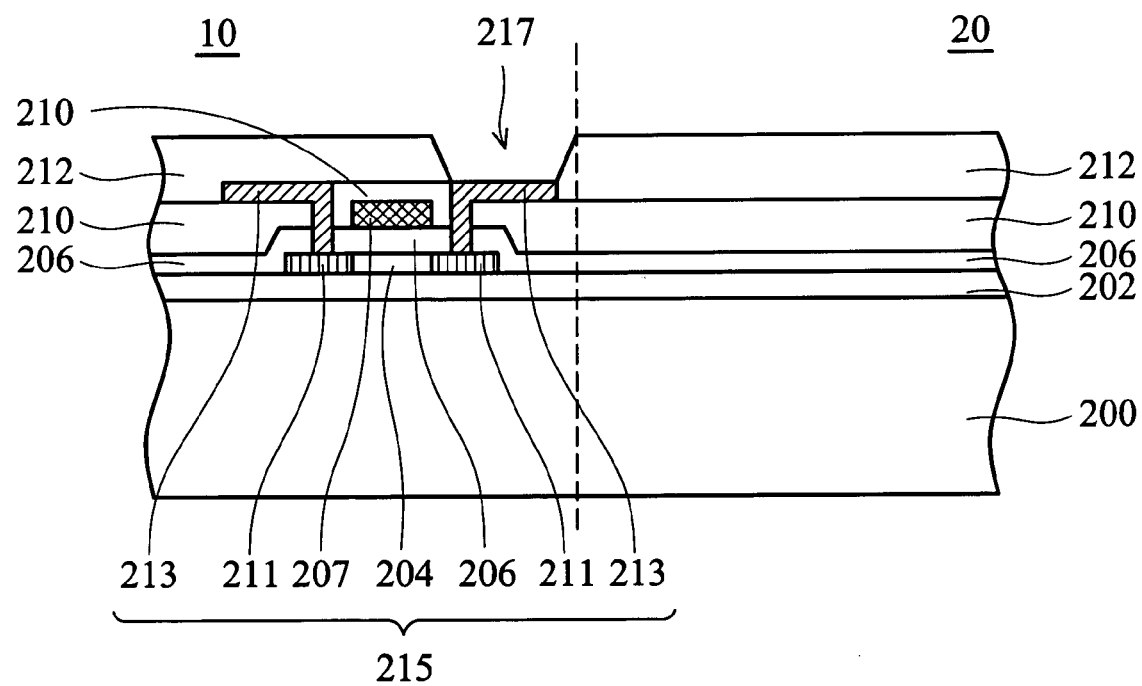
Figure 2E:
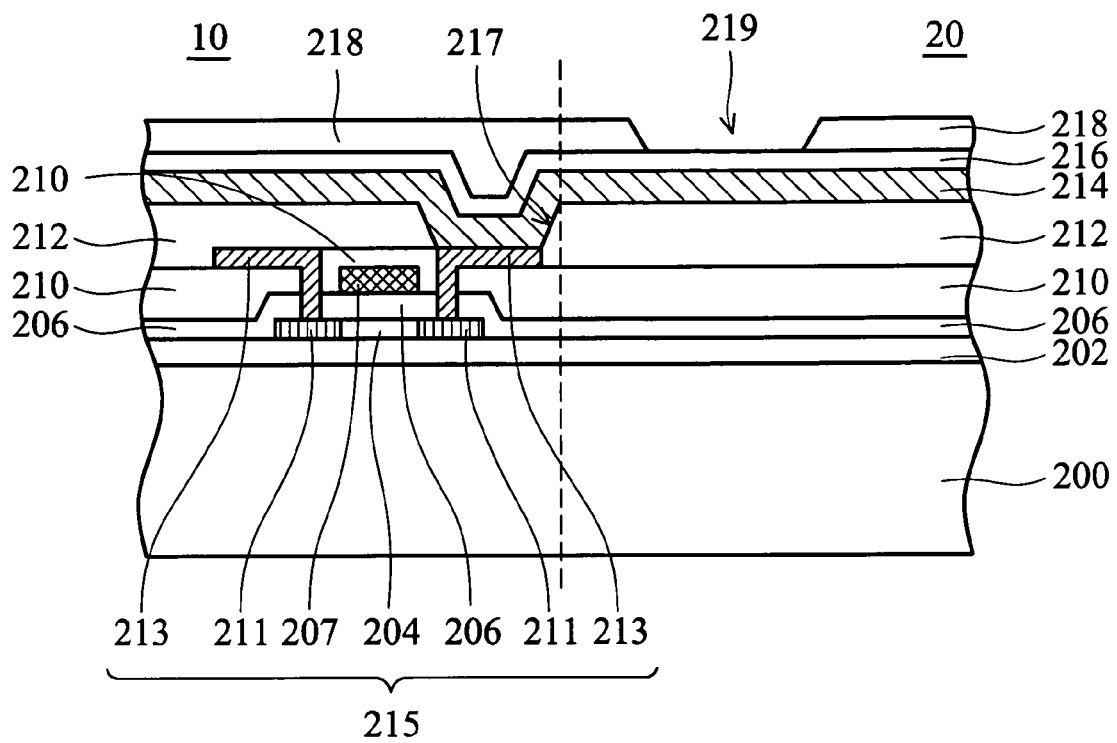
Figure 2F:
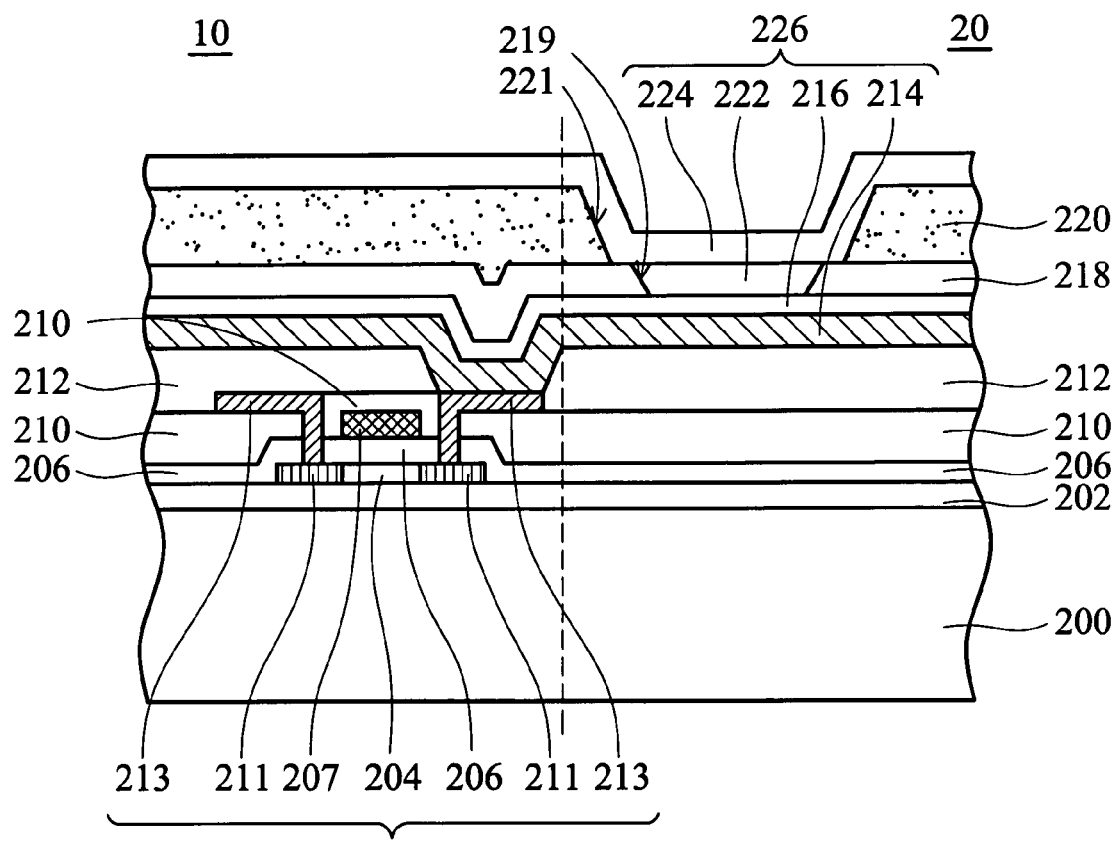

FIGS. 2A to 2F are cross-sections of an embodiment of a method for fabricating a top emission type electro-luminescent display device. As shown in FIG. 2A, a substrate 200, such as a glass or quartz substrate, comprising a plurality of transistor and light-emitting regions for the formation of thin film transistors and the electro-luminescent diodes thereon. Here, in order to simplify the diagram, only a first region 10 and a second region 20 are depicted. For example, the first region 10 may be a transistor region and the second region a light-emitting region. A buffer layer 202 is formed on the substrate 200. In some embodiments, the buffer layer 202 may be a single layer or a stack structure. For example, the buffer layer 202 can comprise a silicon nitride layer and an overlying silicon oxide layer. A semiconductor layer (not shown) is subsequently formed on the buffer layer 202 and then defined by conventional lithography and etching, to form a patterned semiconductor layer 204 over the first region 10 of the substrate 200, serving as the active layer of the thin film transistor.

As shown in FIG. 2B, an insulating layer 206, such as a silicon nitride layer, is formed on the buffer layer 202 and covers the active layer 204, serving as the gate dielectric layer of the thin film transistor. Thereafter, a metal layer (not shown) is formed on the insulating layer 206 and then patterned by conventional lithography and etching to form a patterned metal layer 207 over the first region 10 of the substrate 200, serving as the gate electrode of the thin film transistor. Ion implantation 209 is performed on the active layer 204 using the gate electrode 207 as an implant mask to form source and drain doping regions 211.

An interlayer dielectric layer 210 is deposited overlying the substrate shown in FIG. 2B. Contact holes are subsequently formed on both sides of the gate electrode 207 by etching the interlayer dielectric layer 210 and the underlying insulating layer 206, exposing the source and drain doping regions 211, as shown in FIG. 3C.

As shown in FIG. 2D, a metal layer (not shown) is formed on the interlayer dielectric layer 210 and fills the contact holes to electrically connect the source and drain doping regions 211. The metal layer is then patterned by conventional lithography and etching to form source and drain electrodes 213, thus the fabrication of a thin film transistor 215 is completed over the first region 10 of the substrate 200. An interlayer insulator 212 is deposited on the interlayer dielectric layer 210 over the first and second regions 10 and 20 of the substrate 200 and covers the thin film transistor 215, serving as a planarization layer. An opening 217 is formed in the interlayer insulator 212 to expose a source/drain electrode 213.

As shown in FIG. 2E, an opaque conductive layer 214 is formed on the interlayer insulator 212 and conformally covers the surface of the opening 217 to electrically connect the exposed source/drain electrode 213. The opaque conductive layer serves as an electrode of an electro-luminescent diode and a light reflective layer. Moreover, the opaque conductive layer 214 may be a single metal layer or multiple metal layers. For example, the opaque conductive layer 214 may comprise aluminum, silver, aurum, titanium, nickel, chromium, copper, ferrum, manganese, platinum, zinc, or alloys thereof. In some embodiments, the opaque conductive layer 214 over the second region 20 of the substrate 200 has a relative height exceeding that of the thin film transistor 215, such that the subsequently formed electro-luminescent medium layer can also be relatively higher than the thin film transistor 215, thereby increasing the aperture ratio. A transparent conductive layer 216, such as an indium tin oxide (ITO) or indium zinc oxide (IZO) layer may optionally be deposited on the opaque electrode 214. The transparent conductive layer 216 serves as a portion of the electrode 214 of the electro-luminescent diode, such that work function of the electrode 214 matches the subsequently formed electro-luminescent medium layer. Note that the-subsequently formed electro-luminescent medium layer must be doped for work function match, as without forming the transparent conductive layer 216 between the electro-luminescent medium layer and the electrode 214.

An insulating (passivation) layer 218 is formed overlying the opaque electrode 214 having a transparent conductive layer 216 thereon. An opening 219 is subsequently formed in the insulating layer 218 in the second region 20 of the substrate 200.

As shown in FIG. 2F, an opaque layer 220 is formed on the insulating layer 218 (a critical step of this embodiment). As mentioned, the opaque layer 220 blocks light from lateral scattering by the subsequently formed electro-luminescent medium layer, thereby improving wash out effect. In some embodiments, the opaque layer 220 may comprise metal, metal oxide, organic material (for example, photoresist), or polymer. Preferably, the opaque layer 220 comprises metal, for example, aluminum, silver, aurum, titanium, nickel, chromium, copper, ferrum, manganese, platinum, zinc, or alloys thereof. Moreover, the opaque layer 220 may be a single layer or multiple layers, as the opaque electrode 214. As the opaque layer 220 is metal, lateral scattered light may be blocked in a wave guide constituted by the opaque electrode 214 and the opaque layer 220, thereby reducing light leakage. Another opening 221 is formed in the opaque layer 220 over the opening 219, preferably larger than the opening 219, to block light emitted from the subsequently formed electro-luminescent medium layer. In some embodiments, the opening 221 can be formed across the first and the second regions 10 and 20 of the substrate 200. Thereafter, an electro-luminescent medium layer 222 is formed on the bottom of the openings 219 and 221, which may be a single layer or multiple layers. In some embodiments, the electro-luminescent medium layer 222 may comprise a hole transport layer (HTL), an electron transport layer (ETL), and an active or emissive layer sandwiched in between HTL and ETL. Here, in order to simplify the diagram, only a single layer is depicted. A transparent electrode 224, such as ITO or IZO, is formed on the opaque layer 220 and conformally covers the surfaces of the opening 221 and the electro-luminescent medium layer 222, thus fabrication of an electro-luminescent diode 226 over the second region 20 of the substrate 200 is completed. Since the light is upward released from the electro-luminescent medium layer 222, the electro-luminescent display device called the top emission type.

In some embodiments, the opaque layer 220 may be directly formed on the opaque electrode layer 214 without the insulating layer 218 therebetween. Note that the opaque layer 220 may be an insulating layer in this case. For example, the opaque layer 220 may comprise metal oxide, organic material (such as photoresist), or polymer.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electro-luminescent display device, comprising:
   a substrate comprising a first region and a second region;
   a thin film transistor disposed on the first region of the substrate and comprising a pair of source/drain electrodes;
   an interlayer insulator disposed on the second region of the substrate and covering the thin film transistor;
   an opaque electrode overlying the interlayer insulator and electrically connected to the thin film transistor, wherein one of the pair of source/drain electrodes of the thin film transistor directly contacts the opaque electrode and the other is directly below the opaque electrode;
   an opaque layer, overlying the opaque electrode, having a first opening exposing a portion of the underlying opaque electrode, wherein the opaque electrode is extended across the entire bottom of the opaque layer;
   an electro-luminescent medium layer disposed over the exposed portion of the opaque electrode and apart from the sidewall surface of the first opening and non-contacted with the sidewall surface of the first opening, wherein the top surface of the electro-luminescent medium layer is substantially below the top surface of the opaque layer; and
   a transparent electrode disposed on the opaque layer and directly on the exposed sidewall surface of the first opening and the top surface of the electro-luminescent medium layer.

2. The device as claimed in claim 1, wherein the opaque electrode over the second region of the substrate has a relative position higher than that of the thin film transistor.

3. The device as claimed in claim 1, further comprising an indium tin oxide layer disposed between the electro-luminescent medium layer and the opaque electrode.

4. The device as claimed in claim 1, wherein the opaque electrode comprises metal.

5. The device as claimed in claim 1, wherein the opaque layer comprises an organic material layer, a metal oxide layer, or a polymer layer.

6. The device as claimed in claim 1, further comprising an insulating layer disposed between the opaque electrode and the opaque layer, having a second opening under the first opening and exposing the opaque electrode.

7. The device as claimed in claim 6, wherein the opaque layer comprises a metal layer, an organic material layer, a metal oxide layer, or a polymer layer.

8. The device as claimed in claim 6, wherein the first opening is larger than the second opening.

9. The device as claimed in claim 1, wherein the first opening is in the second region of the substrate.

10. The device as claimed in claim 1, wherein the first opening is across the first and the second regions of the substrate.

11. A method for fabricating an electro-luminescent display device, comprising:
    providing a substrate comprising a first region and a second region;
    forming a thin film transistor comprising a pair of source/drain electrodes on the first region of the substrate;
    forming an interlayer insulator on the second region of the substrate and covering the thin film transistor;
    forming an opaque electrode overlying the interlayer insulator and electrically connected to the thin film transistor, wherein one of the pair of source/drain electrodes of the thin film transistor directly contacts the opaque electrode and the other is directly below opaque electrode;
    forming an opaque layer overlying the opaque electrode, having a first opening exposing a portion of the underlying opaque electrode, wherein the opaque electrode is extended across the entire bottom of the opaque layer;
    forming an electro-luminescent medium layer over the exposed portion of the opaque electrode and apart from the sidewall surface of the first opening and non-contacted with the sidewall surface of the first opening, wherein the top surface of the electro-luminescent medium layer is substantially below the top surface of the opaque layer; and
    forming a transparent electrode on the opaque layer and directly on the exposed sidewall surfaces of the first opening and the top surface of the electro-luminescent medium layer.

12. The method as claimed in claim 11, wherein the opaque electrode over the second region of the substrate has a relative position higher than that of the thin film transistor.

13. The method as claimed in claim 11, further forming an indium oxide layer between the electro-luminescent medium layer and the opaque electrode.

14. The method as claimed in claim 11, wherein the opaque electrode comprises a metal layer.

15. The method as claimed in claim 11, wherein the opaque layer comprises an organic material layer, a metal oxide layer, or a polymer layer.

16. The method as claimed in claim 11, further forming an insulating layer between the opaque electrode and the opaque layer, having a second opening under the first opening and exposing the opaque electrode.

17. The method as claimed in claim 16, wherein the opaque layer comprises a metal layer, an organic material layer, a metal oxide layer, or a polymer layer.

18. The method as claimed in claim 16, wherein the first opening is larger than the second opening.

19. The device as claimed in claim 11, wherein the first opening is in the second region of the substrate.

20. The device as claimed in claim 11, wherein the first opening is across the first and the second regions of the substrate.

* * * * *